United States Patent [19]

Yasui et al.

[11] Patent Number: 4,532,196
[45] Date of Patent: Jul. 30, 1985

[54] AMORPHOUS SILICON PHOTORECEPTOR WITH NITROGEN AND BORON

[75] Inventors: Masaru Yasui, Yokohama; Kazuhisa Kato, Atusgi, both of Japan

[73] Assignee: Stanley Electric Co., Ltd., Tokyo, Japan

[21] Appl. No.: 579,285

[22] Filed: Feb. 14, 1984

Related U.S. Application Data

[63] Continuation of Ser. No. 342,650, Jan. 25, 1982, abandoned.

[51] Int. Cl.$^3$ .................. G03G 13/22; G03G 5/082; G03G 5/09
[52] U.S. Cl. .................................. 430/31; 430/57; 430/95; 430/128; 427/39; 427/74; 252/501.1; 357/2
[58] Field of Search ............... 430/57, 84, 95, 128, 430/31; 427/39, 74; 252/501.1; 357/2

[56] References Cited

U.S. PATENT DOCUMENTS

| | | | |
|---|---|---|---|
| 4,225,222 | 9/1980 | Kempter | 430/95 X |
| 4,226,898 | 10/1980 | Ovshinsky et al. | 427/39 |
| 4,253,882 | 3/1981 | Dalal | 427/74 X |
| 4,265,991 | 5/1981 | Hirai et al. | 430/84 X |
| 4,349,617 | 9/1982 | Kawashiri et al. | 430/95 X |
| 4,356,246 | 10/1982 | Tabei et al. | 430/95 X |

*Primary Examiner*—Roland E. Martin
*Attorney, Agent, or Firm*—Spensley Horn Jubas & Lubitz

[57] ABSTRACT

A photoreceptor of electrophotography having, on a substrate, an amorphous silicon (a-Si) layer formed by relying on plasma CVD technique, wherein the a-Si layer is formed in the presence of silane, diborane and nitrogen, and possibly phosphine as required. This a-Si layer may have a multiple layer structure comprising a thin a-Si layer formed in the presence of silane and diborane or nitrogen, and a principal a-Si layer formed in the presence of silane, diborane and nitrogen, and possibly phosphine as required, but in such instance the amount of phosphine which is added is less than three times that of diborane. Such photoreceptor has a good sensitivity to light rays, has long service life, and is not harmful to human body.

8 Claims, 6 Drawing Figures

AMORPHOUS SILICON PHOTORECEPTOR WITH NITROGEN AND BORON

This is a continuation of Ser. No. 342,650, 1-25-82, abandoned.

BACKGROUND OF THE INVENTION (a) Field of the Inveniton

The present invention relates to an electrophotography, and more particularly it pertains to a new photoreceptor in Carlson's method.

(b) Description of the Prior Art

As the photoreceptors of electrophotography for use in copying machines and laser printing, there have been known those having the structure comprising a substrate plate or body carrying thereon a selenium layer, a zinc oxide layer and either a cadmium sulfide layer having an organic insulating layer on its surface or alternatively an organic semiconductor layer. A photoreceptor having a selenium layer is manufactured usually by forming a film of selenium or selenium-base alloy on an aluminum substrate plate or body by relying on the vacuum deposition technique. Such known photoreceptor has the advantages that selenium possesses a good sensitivity to light rays and contributes to a prolonged service life of the photoreceptor, and also that the manufacturing process which relies on the alloying method allows easy improvement of the sensitivity to light rays and the durability of the photoreceptor. However, the known photoreceptor has problems with respect to the temperature to which the photoreceptor is subjected and also with regards to mechanical strength, leaving behind the problem concerning the handling of the photoreceptors. On the other hand, a photoreceptor having a layer of zinc oxide is prepared by forming a film of zinc oxide powder on a surface of a substrate plate or body by the use of a binding agent to fix the powder which is coated on the substrate plate or body. Such known photoreceptor, in general, has been said to be low in sensitivity to light rays and to be poor in durability. Furthermore, a photoreceptor having a layer of cadmium sulfide is prepared by coating a surface of a substrate with cadmium sulfide powder to form a film thereof which is fixed thereto by a binding agent, and thereafter by covering the resulting surface with a transparent organic insulating substance. The resulting photoreceptor is usually called the NP system which, however, has the disadvantages that the durability of the cadmium sulfide is lower than that of selenium, and that the system itself is complicated. Moreover, this NP system requires a particular copying device which is different from that for other types of photoreceptors. On the other hand, a photoreceptor having an organic semiconductor layer is manufactured by applying an organic semiconductor substance onto a surface of a substrate plate or body to form a photosensitive film thereon. However, such photoreceptor has the disadvantages that the organic semiconductor per se has a low sensitivity to light rays, so that it requires a sensitizing agent. Some of those sensitizers are harmful to the human body, and moreover this type of photoreceptor cannot be termed superior with respect also to its service life.

As discussed above, those conventional photoreceptors of electrophotography invariably have both strong points and weak points. For this reason, various improvements have been studied and attempted in the past, but the present status of the technical field is such that no satisfactory photoreceptor of electrophotography having both sufficient sensitivity to light rays and mechanical as well as thermal strength has ever been obtained so far.

SUMMARY OF THE INVENTION

It is, therefore, the object of the present invention to provide a new photoreceptor of electrophotography which uses, as the light-sensitive substance, amorphous silicon which will hereinafter to be referred to as a-Si which completely differs from the conventional light-sensitive substances.

BRIEF DESCRIPTION OF THE DRAWINGS

FIGS. 1 and 2 are diagrammatic sectional views of a-Si photoreceptor embodiments of electrophotography manufactured according to the present invention, in which:

FIG. 1 is a diagrammatic sectional view of a monolayer photoreceptor, and

FIG. 2 is a diagrammatic sectional view of a multiple-layer photoreceptor.

DETAILED DESCRIPTION OF THE PREFERRED EMBODIMENTS

The abovesaid a-Si can be formed through a glow discharge decomposition of silane by relying on the known plasma CVD(Chemical Vapor Deposition) method. However, because the a-Si thus produced is a low-resistivity substance, it cannot be applied as it is to the electro-photography according to Carlson's method. Nevertheless, many strong points can be expected of a-Si such that it has a sensitivity to a wide range of spectrum of light rays, is innocuous for the body of the human being, is superior in durability and has a long service life.

The present inventors have made various experiments and researches with respect to the manufacture of photoreceptors of electrophotography using a-Si to serve as the light-sensitive substance. As a result, they have found that, by the concurrent mixed use of silane and a selected volume of a gaseous component, there can be obtained, in a relatively short period of time of manufacture, an excellent photoreceptor of electrophotography which possesses the above-mentioned strong points and which is capable of holding a sufficient chargeability. that is, the abovesaid object can be attained by the simultaneous combined use of silane and diborane, or alternatively diborane, nitrogen and phosphine.

Figure 5:
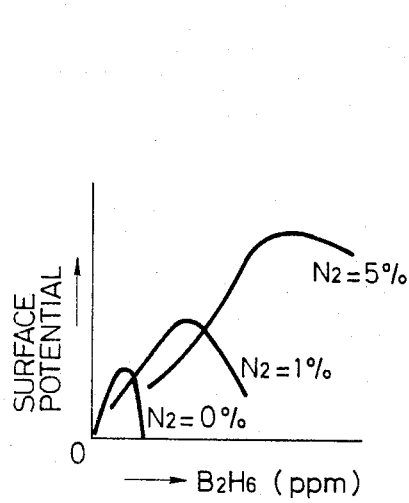
FIG. 5 is a chart showing qualitatively the relationship of charge potential to the quantitative ratio between diborane and nitrogen.

More concretely, the inventors have discovered that, by the introduction of optimum amounts of diborane and nitrogen during the glow discharge decomposition process of silane gas in a hydrogen gas atmosphere, there are produced such properties as shown in FIG. 5. And, by appropriately setting various conditions, the chargeability as well as the potential holdability are improved, and there can be obtained photoreceptor of electrophotography which exhibits satisfactory functions as a photoreceptor of electrophotography without being entailed by significantly lowering its sensitivity to light rays and without impairing various physical properties. FIG. 5 shows qualitatively the relationship of the charged potential relative to the quantitative ratio between diborane and nitrogen. The volume of nitrogen which is introduced is determined according to the RF power. This Figure shows the tendency that, as RF power which is used as the power supply for glow discharge becomes larger, and also as the divided pressure component of nitrogen becomes greater, the value of charge augments but the sensitivity to light rays decreases.

Accordingly, the appropriate range of nitrogen to be applied is 1-20%, preferably 2-15%, by volume relative to the total gas flow rate, when silane is 5-40%, preferably 5-20%, by volume and diborane is 10-500 ppm, preferably 20-100 ppm, by volume, relative to the total gas flow rate. In order to seek a potential holdability and a higher sensitivity to light rays while keeping the optimum range of volume of silane, it is useful to add phosphine in a range of volume not exceeding the limit of three times that of diborane, whereby it is possible to effectively reduce the volume of nitrogen that is introduced.

Now, the instance wherein nitrogen is added according to the present invention is compared with the instance wherein no nitrogen is introduced. Between the two instances, there can be noted a marked difference in the rate of deposition or adherence of a-Si onto the substrate plate or body. For example, in case nitrogen is introduced in an amount of 5% relative to the total volume of gas, the deposition rate of a-Si to the substrate plate or body increases as much as two times or greater that of the instance where no nitrogen is introduced. And, the growth rate of a-Si is about 20Å/sec. Accordingly, in order to form a film of a-Si of 20 micrometers in thickness, this purpose can be achieved within a period of three (3) hours.

Also, the presence and absence of nitrogen has an influence over the formability of a-Si film onto the substrate plate or body. In case no nitrogen is introduced, there has been noted the phenomenon such that, when the film is grown to a thickness of 10 micrometers or more, the a-Si layer tends to come off the substrate plate or body. However, in case nitrogen is introduced, such phenomenon has not been observed even when the film of a-Si is grown to a thickness of as much as 20 micrometers.

Figure 1:
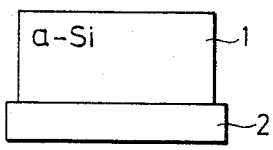
Figure 2:
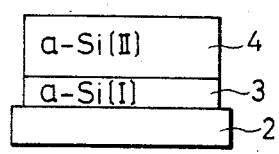

A couple of examples of a-Si base photoreceptor of electrophotography which are manufactured according to the present invention are shown in FIG. 1 and FIG. 2.

In case the a-Si base photoreceptor is manufactured by forming a single layer 1 of a-Si on a substrate plate 2 as shown in FIG. 1, there is exhibited some difference between the magnitude of the positively charged potential and the magnitude of the negatively charged potential due to the quantitative relationship between diborane and nitrogen. However, in case the chargeability and the potential holdability are satisfied, it should be noted that almost equal charged potentials are obtained for both positive and negative charges. It should be noted further that, in case the photoreceptor is provided in the form of a multiple layer structure as shown in FIG. 2 wherein a thin a-Si (I) layer 3 in which only diborane is introduced is provided between the principal a-Si (II) and the substrate 2, the surface of the photoreceptor is charged mainly positive. In contrast thereto, in case the thin intermediate layer 3 is one which is added only with nitrogen, the photoreceptor exhibits mainly the negative charge property. As such, by appropriately selecting the type of gas which is introduced, it is possible to easily form photoreceptors intended mainly for positive charging, mainly for negative charging, and in case of a single a-Si layer, for either positive or negative charging depending on the case by the use of a same photoreceptor.

Figure 6:
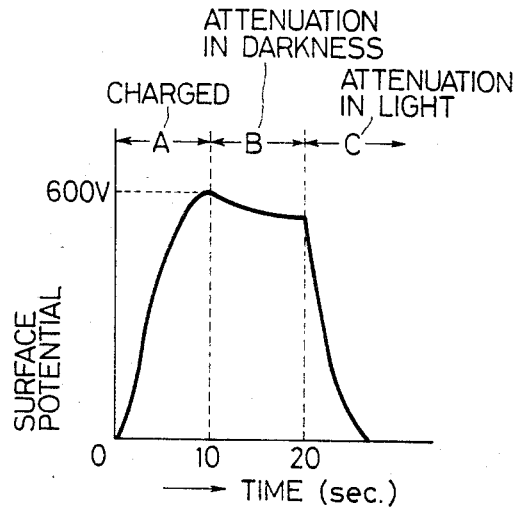
FIG. 6 is a chart showing the general properties which are required for the photoreceptor of electrophotography of the present invention to possess.

FIG. 6 shows general properties which are required to be possessed by a photoreceptor of electrophotography. In FIG. 6, the region A indicates the change, with time, of the charged potential caused by positive or negative corona discharging process. The shorter the time length for the photoreceptor to gain a high potential level is, the better chargeability is exhibited. The region B indicates the change, with time, of attenuation of potential in darkness, i.e. dark attenuation. It will be noted that, the lesser the potential reduction for an extended period of time is, the better potential holding ability is obtained. The region C indicates the change, with time, of potential attenuation due to exposure of the photoreceptor to light rays, i.e. attenuation by illumination. This region shows that the device has such good sensitivity to light that the potential reaches zero potential at the end of a short length of time with a small amount of illumination.

It will be made clear by reading the description of the embodiments which is given later that the photoreceptor of electrophotography according to the present invention possesses all of these properties.

Figures 3, 4:
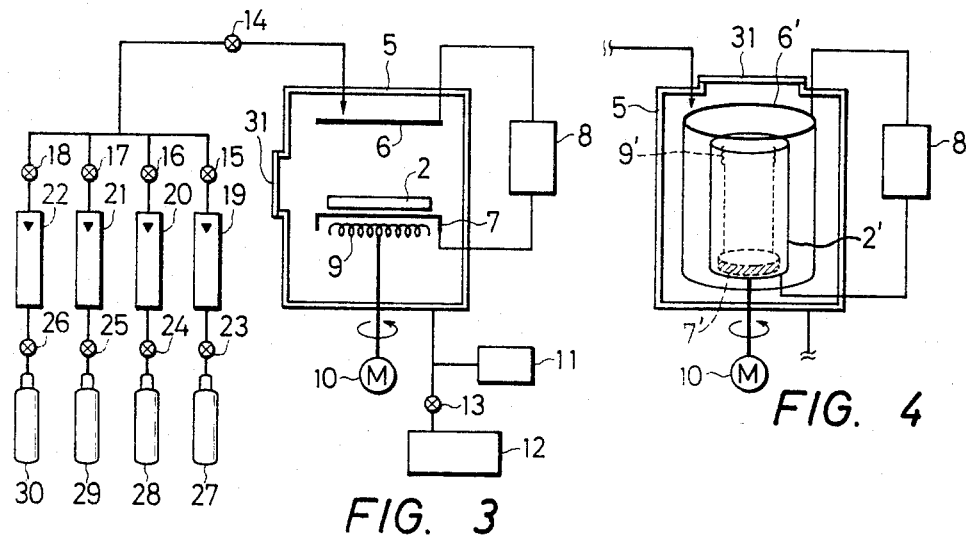
FIG. 3 is a schematic illustration of an apparatus suitable for practicing the present invention.
FIG. 4 is another concrete embodiment of the vacuum vessel shown in FIG. 3.

An embodiment of the apparatus for putting the method of the present invention into practice is shown schematically in FIG. 3. In FIG. 3 is shown a vacuum vessel 5 which is initially evacuated of air and intended for causing evaporation-deposition of an a-Si layer on the substrate 2. On one side of the vacuum vessel 5, there are provided an inlet-outlet of the substrate 2 and its cover 31, and this vessel 5 is communicated, via a evacuation valve 13, to both an evacuation pump 12 and the vacuum gauge 11. The vacuum vessel 5 contains therein electrodes 6 and 7 which are coupled to a high-frequency high-voltage power supply 8, respectively. The electrode 6 can concurrently serve as a gas ejector, whereas the electrode 7 can serve concurrently as a support for supporting the substrate 2. Also, the electrode 7 can be rotated by a motor 10, and this electrode can be heated by a heater 9 which is provided at the underside of the electrode 7. The gaseous mixture which is supplied to the vacuum vessel 5 is introduced therein through a piping which is connected to a group of gas containers 27-30 via a closing valve 14. The container 27 is filled with either monosilane ($SiH_4$) gas or disilane ($Si_2H_6$) gas which has been diluted with hydrogen ($H_2$) to a predetermined concentration (5-20%). The container 28 contains diborane ($B_2H_6$) gas which has been diluted with hydrogen to a predetermined concentration (20-10000 ppm). The container 29 is filled with phosphine ($PH_3$) gas which has been diluted with hydrogen to a predetermined concentration (100-10000 ppm). The container 30 is filled with pure nitrogen gas. These respective containers are coupled to pressure-controlling valves 23-26 and also to flow rate gauges 19-22, and it is possible to introduce gases into the vacuum vessel 5 through the closing valve 14 while adjusting the flow rate of the respective gases by means of flow rate adjusting valves 15–18.

FIG. 4 shows another type of vacuum vessel 5 shown in FIG. 3, and the internal arrangement of the vessel is modified from that of FIG. 3. In FIG. 4, the electrodes 6' and 7' are each formed to have a hollow cylindrical shape. The substrate 2' also is of a cylindrical shape. By fitting the cylindrical substrate 2' into the cylindrical electrode 7', or by externally mounting the substrate 2' onto the electrode 7', the electrode 7' can be structured so as to serve as the opposing electrode of the electrode 6'. Thanks to this arrangement, it is possible to form a photoreceptor having a drum-like configuration.

Next, description will be made of those conditions for operating the apparatus having these elements. The evacuation valve 13 is opened, and the evacuation pump 12 is actuated, to thereby evacuate the air contained in the vessel 5. While watching the evacuation gauge 11, a vacuum level of $10^{-3}$ Torr or lower is held. Then, by means of the heater 9, the supporting electrode 7 which supports the substrate 2 is heated to a predetermined temperature (100°–400° C.), and once this predetermined temperature has been gained, this temperature level is maintained. Then, by adjusting the flow rate adjustment valves 15–18, and by opening the valves 23–26 when a certain pressure (1 kg/cm$^2$) is gained, silane gas, diborane gas, nitrogen gas, and depending on case, phosphine gas are mixed together at a predetermined ratio. Thereafter, the valve 14 is opened to introduce the mixed gas into the evacuated vessel 5. Concurrently therewith, the evacuation valve 13 is adjusted, and while watching the vacuum gauge 11, the interior of the vessel 5 is held at a predetermined pressure (0.1–5 Torr). Then, the vessel is connected to the high-frequency high-voltage power supply (RF power supply) 8, and while maintaining a predetermined power level, glow is developed across the opposing electrodes. The flow rate of the mixed gas and the level of the electric power which is supplied to the vessel 5 can vary with the size of the vessel 5 and with the areas of the electrodes employed. However, generally, the employed predetermined values thereof are: silane gas 100–500 SCCM (Standard Cubic Centimeters per Minute, i.e., a volumic rate of flow in units of cubic centimeters per minute at 20° C. and at 1 atmosphere pressure), diborane gas 1–50 SCCM, nitrogen gas 1–50 SCCM, and power 100–500 V, relative to the vessel volume of 15 liters and the electrode area of 300 cm$^2$. These predetermined values may be considered to be able to vary in proportion to the alteration of the size of the vacuum vessel and to the sizes of the electrodes. After maintaining, for a predetermined length of time, the gas pressure, gas flow rate, the temperature and power to predetermined values, respectively, the RF power is cut off, the respective valves ae closed, and the residual gas is discharged, and then the heater is cut off. At the end of several minutes, the valve 13 is closed, and nitrogen gas is introduced into the vacuum vessel 5 to break vacuum. At the moment that the interior of the vessel is returned to normal pressure, the cover 31 is opened to remove the substrate 2 to the outside of the vessel.

In a manner as described above, there is obtained a photoreceptor having an a-Si layer laminated on a surface of the substrate 2 as shown in FIG. 1. It should be understood that, in the manufacturing process stated above, if the selection of the gases which are introduced is effected in such manner that, for the initial period of manufacture of 5 to 30 minutes, the gas or gases are limited only to diborane or only silane and nitrogen, and after the RF power supply is maintained for said period of time, the valve for nitrogen or diborane is opened continuously for a predetermined length of time, there can be formed a multiple-layer photoreceptor having the structure comprising a thin a-Si layer (I) formed at a site close to the substrate 2 and a main a-Si layer (II) on top of said thin a-Si layer as shown in FIG. 2. The gases for the formation of the principal a-Si layer in the abovesaid manufacturing process are silane, diborane and nitrogen as the principal component gases, and if desired phosphine may be added thereto. It should be noted, however, that the amount of phosphine which is added should not exceed the amount which is three times that of diborane, and that the amount of nitrogen is adjusted in accordance with the amount of phosphine which is added.

The present invention will be described in more concrete way with respect to the following examples.

EXAMPLE 1

The apparatus shown in FIG. 3 was used to produce a photoreceptor sample A of electrophotography according to the below-mentioned manner of manufacturing process, and evaluation of the properties as required for electrophotography was made, and this Sample A was given an image-forming treatment.

Gas containers 27, 28, 29 and 30 containing therein a mixed gas of 10% by volume of silane and 90% by volume of hydrogen, a doping gas of 1000 ppm of diborane and the remainder hydrogen, a doping gas of 1000 ppm of phosphine and the remainder hydrogen, and pure nitrogen gas, respectively, were prepared. An alminum substrate 2 of 100 mm × 100 mm having been given a surface treatment and cleaned was fixed at the central portion of a supporting electrode 7. Then, the air in the vacuum vessel 5 was evacuated to a level of $10^{-3}$ Torr or lower. The heater was actuated to elevate the temperature of the supporting electrode to 250° C., and this temperature was maintained thereafter. Then, the valves 23, 24, 26 and 14 were opened. While watching the flow rate gauges 19, 20 and 22, the valves 15, 16 and 18 were adjusted to supply 300 SCCM of silane gas, 15 SCCM of diborane gas and 15 SCCM of nitrogen gas, respectively, and the valve 13 was adjusted so that the overall system would indicate 3 Torr.

The conditions of gas flow rate are as follows:

| | |
|---|---|
| Gas mixture (10% of silane and 90% of hydrogen) | 300 SCCM |
| Diborane (1000 ppm) and hydrogen | 15 SCCM |
| Nitrogen | 15 SCCM |
| TOTAL | 330 SCCM. |

Accordingly, the flow rates of respective gases are:

| | |
|---|---|
| Silane | 30 SCCM |
| Diborane | 0.015 SCCM |
| Nitrogen | 15 SCCM. |

The proportions of respective gases to the total flow rate are:

| | | |
|---|---|---|
| Silane | 30/300 = 0.091 | 9.1% |
| Diborane | 0.015/330 = 0.000045 | 45 ppm |

| -continued | | |
|---|---|---|
| Nitrogen | 15/330 = 0.045 | 4.5%. |

Then, the vessel was connected to RF power supply of 13.56 MHz to develop glow. While the power was held at 300 W, the entire system was held for 3 hours under identical conditions. At the end of 3 hours, the vessel was cut off from the RF power supply, and also from the heater, and the respective valves were closed to cease the introduction of the gases. For 5 minutes following the cease of supply of gases, the residual gases were discharged. Then, the valve 13 was closed, and nitrogen was introduced into the evacuated vessel. Confirming that the interior of the vessel is at normal pressure, the cover 31 was opened to remove the sample therefrom. This sample was labeled Sample A.

Separately of the above Sample A, Control Samples B and C were produced in a manner similar to that for Sample A. Sample B was produced without opening the valves 26 and 18, i.e. under the same manufacturing conditions as those for Sample A with the exception that no nitrogen was introduced. Sample C was prepared without opening the valves 24 and 16, i.e. under the conditions similar to those for Sample A excepting that diborane was not introduced. Sample B thus prepared was noted, when same was taken out of the vessel, that about ¼ of the surface portions was scaled off so that the product contained portions whereat no light-sensitive member (a-Si) was laminated.

Samples A, B and C which were thus prepared were charged by corona discharging technique of positive and negative polarities, and variation of the charged potential of each photoreceptor was measured by a surface potentiometer (Model No. SS VII-40 made by Kawaguchi Denki Co.) in darkness and after irradiation of an illumination of 4 luxes in intensity. The result of measurements is shown in Table 1. It is to be noted here that the measurement of Sample B was made of only those portions where an a-Si layer was formed, i.e. those portions where this layer did not come off.

TABLE 1

| Sample | Introduced gas or gases | Thickness of film | Value of charge by positive corona discharge | Half life cycle | Amount of light required for half life | Value of charge by negative corona discharge |
|---|---|---|---|---|---|---|
| A | Nitrogen + Diborane | 18μ | 750 V | 15 sec. | 2.5 luxes/sec. | −600 V |
| B | Diborane | 8μ | 50 V | 1 sec. | ** | 0 |
| C | Nitrogen | 16μ | 8 V | * | ** | −12 V |

Notes:
*represents the instance where no calculation was possible due to the measurement values being trivial.
**represents the instance where no calculation was possible due to lack of potential holdability.

From the result shown in Table 1, it was found that the Control Samples B and C invariably exhibited poor chargeability and potential holdability, and therefore, they lacked the properties required for electrophotography. In contrast thereto, Sample A according to the present invention was noted to sufficiently satisfy all of the electrophotographic properties such as chargeability, potential holdability and sensitivity to light rays.

Next, the three kinds of samples were charged in darkness by a positive corona charger, and image exposure was carried out by the use of a light source of 4 luxes to thereby form a latent image. This latent image was developed by a toner which has been negatively charged up by the magnetic brushing method. The developed image was transferred onto an image transfer paper and fixed. As a result, Sample A showed a clear image, whereas Samples B and C completely failed to produce an image.

EXAMPLE 2

Sample D was prepared by maintaining the same conditions as those for Example 1 for 2 hours and 45 minutes, by continuing glow discharge for 15 minutes in the manufacturing process of Example 1 while the valves 24 and 16 were kept closed, i.e. without introducing diborane. Apart therefrom, Sample E was prepared by maintaining the same conditions as those for Example 1 for 2 hours and 45 minutes, by continuing flow discharge for 15 minutes while the valves 26 and 18 were kept closed, i.e. without introducing nitrogen. Then, the valves 26 and 18 were opened. These samples were evaluated in the same manner as that for Example 1, and the result was compared with that of Sample A, with the result as shown in Table 2.

TABLE 2

| Sample | Layer closer to substrate | Value of charge by positive corona discharge | Value of charge by negative corona discharge |
|---|---|---|---|
| A | None | +750 V | −600 V |
| D | Nitrogen only | +150 V | −750 V |
| E | Diborane only | +650 V | −80 V |

As a result, it was found that Sample A having a single layer structure had both positive and negative chargeability. Among those samples having multiple-layer structure, Sample D mainly had negative chargeability. Sample E mainly had positive chargeability. It was thus found that controlling of polarity of charging can be carried out easily.

EXAMPLE 3

In the process of manufacture of Example 1, additionally the valves 25 and 17 were opened to introduce 20 SCCM of phosphine, while the rate of introduction of nitrogen was reduced to 10 SCCM, and under the remaining conditions being same as for Example 1, Sample F was prepared. As a control sample, Sample G was prepared while keeping the valves 25 and 17 closed, i.e. without introducing phosphine, and setting the amount of nitrogen reduced as stated just above.

The conditions of gas flow rate are as follows:

| | |
|---|---|
| Gas mixture (10% of silane and 90% of hydrogen) | 300 SCCM |
| Diborane (1000 ppm) and hydrogen | 15 SCCM |
| Nitrogen | 10 SCCM |
| Phosphine (1000 ppm) and hydrogen | 20 SCCM |

|   |   |   |
|---|---|---|
| -continued |   |   |
| TOTAL | 345 SCCM. |   |

Accordingly, the flow rates of respective gases are:

|   |   |   |
|---|---|---|
| Silane | 30 SCCM |   |
| Diborane | 0.015 SCCM |   |
| Nitrogen | 10 SCCM |   |
| Phosphine | 0.02 SCCM. |   |

The proportions of respective gases to the total flow rate are:

| Silane | 30/345 = 0.087 | 8.7% |
|---|---|---|
| Diborane | 0.015/345 = 0.000043 | 43 ppm |
| Nitrogen | 10/345 = 0.029 | 2.9% |
| Phosphine | 0.02/345 = 0.000058 | 58 ppm. |

Using the same manner as for Example 1, the respective samples were evaluated. As a result, the properties as mentioned in Table 3 were obtained.

TABLE 3

| Sample | Phosphine | Value of charge by positive corona discharge | Amount of exposure to light for half life |
|---|---|---|---|
| F | Present | 550 V | 1.2 luxes/sec. |
| G | None | 250 V | 1.2 luxes/sec. |

As a result, it was found that in case the amount of introduction of nitrogen was reduced, the loss of chargeability was suppressed by the addition of phosphine, and that concurrently therewith the sensitivity to light rays was markedly improved.

The photoreceptor which carries the a-Si layer according to the present invention has a very high surface hardness, is superior in resistance to heat, and has an even sensitivity for the entire spectrum of light. Accordingly, the device can be said to be a photoreceptor of electrophotography having concurrently a superior durability and higher sensitivity as compared with conventional photoreceptors. Thus, it has a wide range of utility in various ways as for copying machine, printer-facsimile, input-output terminal devices of electronic computer, image-photographying tube and other articles to which a photoreceptor is applied. Also, because the photoreceptor of the present invention does not contain any components detrimental to the human body, there is not entailed by the problem of pollution. Furthermore, since the photoreceptor uses silicon as its main component, there is no limit of material supply for the preparation thereof. In addition, its manufacture is simple. Thus, the photoreceptor according to the present invention has many advantages.

The layer which constitutes the photoreceptor of electrophotography according to the present invention is herein called "amorphous silicon (a-Si) layer. As is clear from the detailed description of the invention and also from the Examples stated above, said amorphous silicon should not be limited to pure amorphous silicon in its narrow meaning. The terms "limited" hereinabove mentioned points to perfect amorphous state and also to pure silicon.

It is commonly known that the silicon layer which is formed by relying on the plasma CVD method using silane contains a large amount of hydrogen. In such instance, this silicon layer should never be excluded as not being the abovesaid amorphous silicon in its narrow sense. Accordingly, it should be understood that, even when the layer being formed in such manner that, during its formation, a relatively large amount of nitrogen is concurrently present during the vapor deposition step as in the present invention, contains a relatively large amount of nitrogen, such silicon layer should not be limited as being out of the scope of amorphous silicon (a-Si). It is also a commonly accepted knowledge that there could be the presence of fine crystals in the layer formed under various conditions in such layer-forming technique or there could be the presence of polycrystals therein. Accordingly, there should be no reason for limiting amorphous silicon (a-Si) herein used only to those instances which exclude such particular instances as mentioned just above.

The amorphous silicon (a-Si) which is used in the present invention points to the general terms of substances whose principal component is amorphous silicon. As such, even in case it contains hydrogen, nitrogen and other elements, or even when it is finely crystalline or poly-crystalline, the amorphous silicon in the present invention does never depart from the range which can be easily conceived by those skilled in the art, regardless of the magnitude of amount of such a-Si content in the layer.

What is claimed is:

1. A process for electrophotography comprising:
providing on a substrate a layer of amorphous silicon having a dark conductivity of less than about $10^{-12}$ (ohm cm)$^{-1}$,
charging the surface of said layer to an electrical potential above about 500 volts, said charge being retained on said surface for a half-life of at least 15 seconds as a result of said low dark conductivity value without the use of a charge transport layer, and
selectively exposing said layer to light so as to form a latent image represented by the residual charge on said layer, and wherein said step of providing comprises:
forming said amorphous silicon (a-Si) layer on said substrate by a plasma chemical vapor deposition (CVD) technique using silane and both boron and nitrogen containing gasses.

2. A photoreceptor of electrophotography having, on a substrate, an amorphous silicon (a-Si) layer formed by relying on plasma CVD technique, wherein said a-Si layer is formed in the presence of silane, diborane, nitrogen and hydrogen, said layer having a dark conductivity of less than about $10^{-12}$ (ohm cm)$^{-1}$ and being exposed for the application thereto of an electrical charge, said photoreceptor having no charge transport layer.

3. A photoreceptor of electrophotography having, on a substrate, an amorphous silicon surface layer formed by relying on plasma CVD technique, wherein said amorphous silicon surface layer is formed in the presence of 5-40% by volume of silane, 10-500 parts per million by volume of diborane, and 1-20% by volume of nitrogen and the remainder of hydrogen, relative to the total flow rate of gas of the above-mentioned substances, and further including a thin layer of amorphous silicon, said thin layer being formed in the presence of:
1-20% by volume of nitrogen;
5-40% by volume of silane; and
the remainder of hydrogen relative to the total flow of gas of the above-mentioned substances.

4. A photoreceptor as described in claim 3, wherein said thin layer is formed on top of the substrate and the preferred ranges for forming the thin layer are:
2-15% by volume of nitrogen; and
5-20% by volume of silane.

5. A photoreceptor as described in claim 4, wherein phosphine is added as required while forming the surface silicon layer and wherein the volume of phosphine is less than three times the volume of diborane.

6. A photoreceptor of electrophotography formed on a substrate, said photoreceptor comprising:
an electrical charge retaining layer of amorphous silicon characterized by the combined presence therein of nitrogen, boron and hydrogen to provide a dark conductivity of less than about $10^{-12}$ (ohm cm)$^{-1}$, said layer having a surface exposed for the application thereto of an electrical charge, said photoreceptor having no charge transport layer.

7. A photoreceptor for electrophotography comprising, on a substrate, an amorphous silicon (a-Si) layer formed by a plasma chemical vapor deposition (CVD) technique using silane and both boron and nitrogen containing gasses, so that said a-Si layer exhibits a dark conductivity of less than about $10^{-12}$ (ohm cm)$^{-1}$, said photoreceptor having no charge transport layer.

8. A photoreceptor for electrophotography comprising, on a substrate, an amorphous silicon (a-Si) layer formed by a plasma chemical vapor deposition (CVD) technique using silane and both boron and nitrogen containing gasses, so that said a-Si layer exhibits a dark conductivity of less than about $10^{-12}$ (ohm cm)$^{-1}$, and wherein the upper surface of said a-Si layer is exposed for the application thereto of an electrical charge.

* * * * *